United States Patent
Van Der Vleuten et al.

(10) Patent No.: US 6,580,379 B2
(45) Date of Patent: Jun. 17, 2003

(54) ARITHMETIC DECODING OF AN ARITHMETICALLY ENCODED INFORMATION SIGNAL

(75) Inventors: Renatus Josephus Van Der Vleuten, Eindhoven (NL); Bernardus Antonius Maria Zwaans, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/144,814

(22) Filed: Oct. 25, 2001

(65) Prior Publication Data
US 2003/0080883 A1 May 1, 2003

Related U.S. Application Data

(63) Continuation of application No. PCT/EP01/02347, filed on Mar. 1, 2001.

(30) Foreign Application Priority Data

Mar. 7, 2000 (EP) ............................................. 00200805

(51) Int. Cl.$^7$ ................................................ H03M 7/00

(52) U.S. Cl. ............................ 341/107; 341/50; 341/51

(58) Field of Search ............................ 341/50, 51, 106, 341/107

(56) References Cited

U.S. PATENT DOCUMENTS

| | | | | |
|---|---|---|---|---|
| 6,144,320 A | * | 11/2000 | Van Der Vleuten | .......... 341/50 |
| 6,269,338 B1 | | 7/2001 | Bruekers et al. | ............ 705/500 |
| 6,289,306 B1 | | 9/2001 | Van Der Vleuten et al. | .......................... 704/219 |

FOREIGN PATENT DOCUMENTS

| | | | | |
|---|---|---|---|---|
| EP | 0895361 A2 | 2/1999 | ............ | H03M/7/40 |
| WO | WO9949579 | 9/1999 | ............ | H03M/7/40 |

OTHER PUBLICATIONS

G.G. Langdon, "An Introduction to Arithmetic Coding", IBM J. Res. Development, vol. 28, p. 135–149, Mar. 1984
F. Bruekers et al., "Improved Lossless Coding of 1–bit Audio Signals", Presented at 103$^{rd}$ Convention of AES, Sep. 26–29, 1997, New York, preprinted 4563 (I–6).
"Speed–Up Mode for Q–Coder Software Implementation", IBM Technical Disclosure Bulletin, US, IBM Corp., New York, vol. 32, No. 8B, 1990, pp. 17–20, XP000082193.

* cited by examiner

Primary Examiner—Peguy JeanPierre
(74) Attorney, Agent, or Firm—Michael E. Belk

(57) ABSTRACT

The invention relates to measures to improve an arithmetic decoder. The method of arithmetically decoding an arithmetically encoded information signal into an information signal comprising a serial sequence of n-bit symbols is adapted to decode two subsequent symbols of the information signal in one decoding cycle if the first symbol to be decoded has the most probable symbol.

13 Claims, 5 Drawing Sheets

ARITHMETIC DECODING OF AN ARITHMETICALLY ENCODED INFORMATION SIGNAL

This application is a continuation of PCT/EP01/02347 filed Mar. 1, 2001.

FIELD OF THE INVENTION

The invention relates to a method of arithmetically decoding an arithmetically encoded information signal into an information signal comprising a serial sequence of n-bit symbols, where n is an integer and n=1, the method comprising the steps of:

(a) receiving the arithmetically encoded information signal, (b) retrieving from finite-size first and second registers values for an A and a C parameter respectively, the A parameter having a relationship with the size of a value interval, the C parameter having a relationship with a boundary of said interval, (c) generating at least one probability value for an associated symbol to be decoded, (d) deriving a symbol in response to the said at least one probability value, and in response to the values for A and C retrieved from said first and second registers, respectively, (e) updating at least the A parameter in order to obtain the new size of the interval for decoding the next symbol of the information signal, (i) outputting the decoded symbol, (j) as the case may be,
 renormalizing the updated A parameter so as to obtain a renormalized A parameter, and
 updating the C parameter so as to obtain an updated C parameter, (k) storing the A parameter and the C parameter obtained in step (j) in the first register and the second register, respectively.

The invention also relates to an apparatus for decoding the arithmetically encoded information signal.

BACKGROUND OF THE INVENTION

The method defined in the opening paragraph is known from WO 99/49579 (PHN 16.822). Arithmetic coding is a well-known technique for lossless coding and an introduction can be found in any current source-coding book. For a thorough understanding of the implementations of arithmetic coding that are most relevant for the current work, the reader is referred to [Lang84]. The history of arithmetic coding is comprehensively described in the appendix of said document.

The known method sequentially decodes symbols retrieved from the encoded information signal so as to obtain decoded symbols.

SUMMARY OF THE INVENTION

The implementation of arithmetic coding that is the subject of the present invention uses two finite-size registers, which are usually called C and A. The decoder flow diagram is shown in FIG. 1. FIG. 2 shows the flow diagram for the "Output symbol . . . " block shown in FIG. 1, for the case binary symbols have to be decoded. MPS and LPS are the most probable symbol and least probable symbol, respectively. Parameter p is the probability of the LPS. The value of the bit that is decoded is put in b. FIG. 3 shows a flow diagram of the decoder block denoted "Renormalize . . . "in FIG. 1. The blocks in the decoder flow diagram in FIG. 1 are normally implemented in dedicated hardware to enable the received information to be decoded signal real-time. FIG. 1 shows a loop. When the decoding process executes the loop one time, one decoded symbol is outputted. The time needed to obtain one decoded symbol depends on the time needed to execute the three operations in the loop shown in FIG. 1. The execution of an operation should not be started until the execution of a previous operation in the loop has been finalized. To decrease the execution time, the decoder is implemented in dedicated hardware. In a software implementation the execution time of the "Renormalize A . . . " block is related to the value of the A parameter. FIG. 3 shows that depending on the value of A, the loop has to be executed a number of times. For example, for the application of SACD, the maximum number of times the loop may be executed is seven times. However, when implemented in dedicated hardware, the execution time is related to the worst case situation and thus to the situation the loop has to be executed that the maximum number of times. Since the worst case situation occurs only a few times in the decoding process, the "Renormalize A . . . " block is a limiting factor for the time needed to sequentially obtain one decoded symbol.

The invention aims at improving for the above-described arithmetic decoders. In accordance with the invention, the method of arithmetically decoding an arithmetically encoded information signal into an information signal comprising a serial sequence of n-bit symbols, n being an integer for which n≧1, the method being adapted to obtain two subsequent output symbols from the information signal in one decoding cycle, comprises the steps of:

(a) receiving the arithmetically encoded information signal, (b) retrieving from finite-size first and second registers values for an A and a C parameter respectively, the A parameter having a relationship with the size of a value interval, the C parameter having a relationship with a boundary of said interval, (c) generating a first probability value for a first symbol to be decoded, said first probability value indicating the probability that the first symbol has a least probable value, and generating a second probability value for a subsequent symbol to be decoded, said second probability value indicating the probability that the second symbol has the least probable value, the first symbol to be decoded being assumed to have the most probable value, (d) deriving the first symbol in response to the said first probability value, and in response to the values for A and C retrieved from said first and said second registers, respectively, (e) updating the A parameter so as to obtain an updated A parameter, (f) updating the value for A retrieved from said first register to a value for a temporary A parameter, using the assumption that the first symbol obtained from decoding has the most probable value, (g) deriving a temporary C parameter from the C parameter retrieved from said second register, (h) deriving the second symbol in response to the said second probability value, and in response to the values of the temporary A parameter and the temporary C parameter, (i) outputting both the first and the second symbol when the first symbol has the most probable value or outputting the first symbol only if the first symbol has the least probable value, (j) deriving new A and C parameters, (k) storing the new A and C parameter in the first and second register, respectively.

The invention is based on the following recognition. At the beginning of the execution of the loop the value of the A parameter is $\geq \frac{1}{2}$ and $<1$. The probability value for the first symbol to be decoded being a least probable symbol value, $p_1 \leq \frac{1}{2}$. When assuming that the first symbol to be decoded has the most probable symbol value, the next value of the A parameter, according to the flow diagram in FIG. 2, will be A−Z, wherein $Z = A * p_1$. Thus, the next value of $A = A * (1-p_1)$ and therefore $\frac{1}{4} \leq$ the next value of $A < 1$. This means that when the first symbol to be decoded has the most probable symbol value, the loop in the "Renormalize A . . . " block has to be executed at most once. The time to execute this "Renormalize A . . . " function in dedicated hardware will be much shorter than the time to execute the "Renormalize A . . . " function when decoding only one symbol per decoding cycle, which execution time depends on the maximum number of times the loop in said function could be executed. Thus, in the case that the first output symbol of two subsequent output symbols has the MPS value, the time required to obtain said subsequent output symbols will be shorter than the time required to obtain each of the output symbols sequentially by decoding one output symbol per decoding cycle according to the prior art decoding method.

Therefore, in accordance with the invention, the prior-art decoding method in which one output symbol per decoding cycle is obtained is performed and a method in which two output symbols per decoding cycle are obtained, assuming that the first symbol to be decoded has the most probable value is performed in parallel. Depending on the symbol value of the first decoded symbol one or two decoded symbols will be obtained per decoding cycle. As a result of the parallel execution of the steps to determine one decoded output symbol and the steps to determine two decoded output symbols assuming that the first output symbol has the MPS value, the time to decoded an encoded information signal is reduced.

BRIEF DESCRIPTION OF THE DRAWINGS

These and other aspects of the invention will be described in more detail hereafter with reference to the drawings, in which " in FIG. 1, for the binary case, the LPS probability being p and the value of the bit that is decoded being put in b.

DETAILED DESCRIPTION OF THE INVENTION

Figure 4:
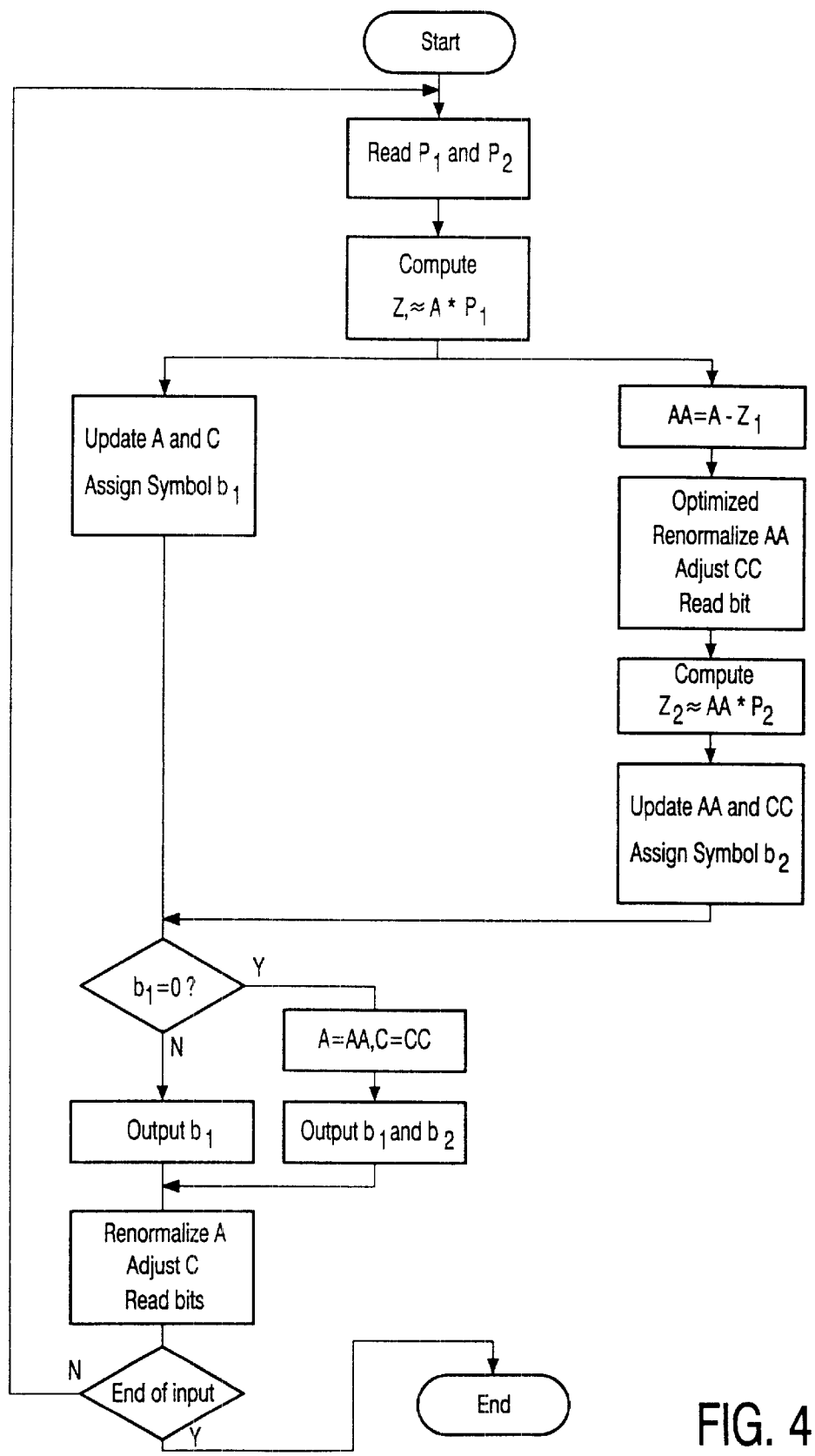
FIG. 4 shows a flow diagram of a decoder in accordance with the invention.

FIG. 4 shows a flow diagram of a decoder in accordance with the invention adapted to decode one or two bits, depending on the value of the first bit to be decoded. When the first bit turns out to be a one (the least probable symbol, LPS), only this single bit is decoded. When the first bit is a zero (the most probable symbol, MPS), however, always two bits are decoded, irrespective of the value of the second bit. Thus, the groups of decoded bits (MPS,MPS)=(0,0) and (MPS,LPS)=(0,1) are used.

The flow diagram has two main branches. The first branch, shown on the left, is the standard flow for decoding a single symbol. The second branch, on the right, speculatively decodes the second bit, assuming that the first decoded symbol has the MPS value. By making this assumption, decoding of the second bit can already start before the first bit has been decoded completely. Thus, when the first bit indeed turns out to have the MPS value, the second bit is also available and can be sent to the output as well. When the first bit turns out to have the LPS value, the results of the second branch are simply discarded.

The flow diagram will now be described in a little more detail.

The "Read $p_1$ and $p_2$" block of FIG. 4 retrieves the probabilities values $p_1$ and $p_2$. The probability $p_1$ is just the normal value that is always used for decoding a single bit and is the probability that the first symbol to be decoded has the LPS value. The probability $p_2$ is the probability that the second symbol to be decoded has the LPS value, assuming that the first symbol to be decoded has the MPS value. An external model produces the second probability $p_2$ in the normal way, but looks one step ahead by filling in the MPS value for the unknown first bit.

Figure 1:
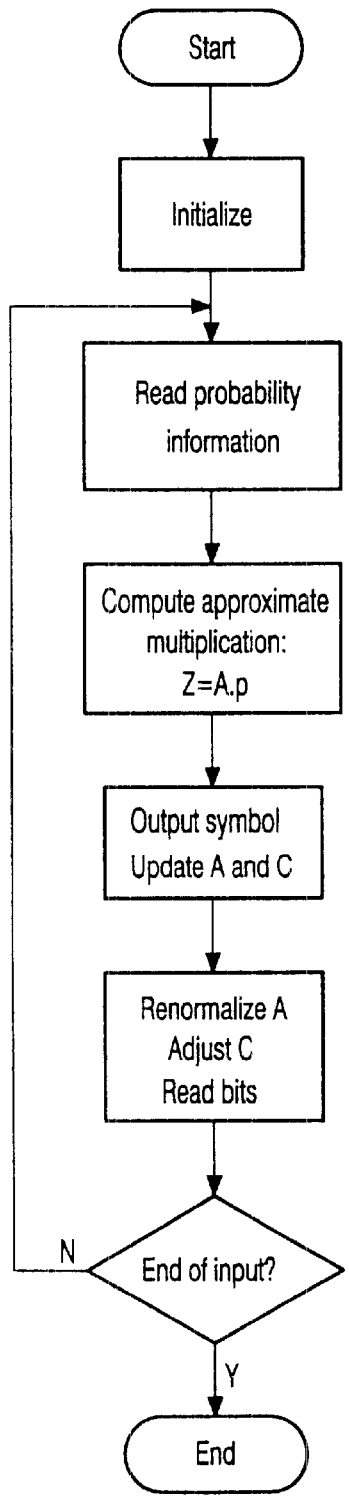
FIG. 1 shows a flow diagram of a prior art arithmetic decoder.
Figure 2:
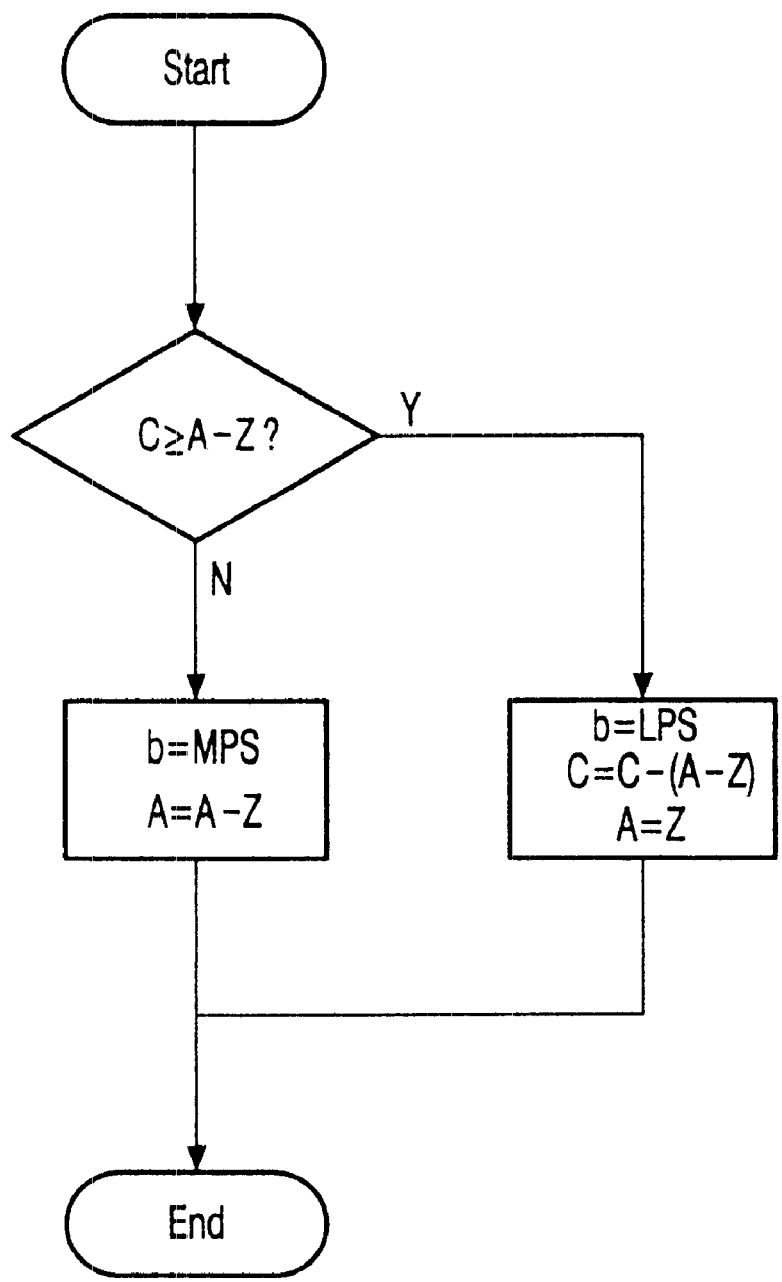
FIG. 2 shows a flow diagram for decoder block "Output symbol . . .
Figure 3:
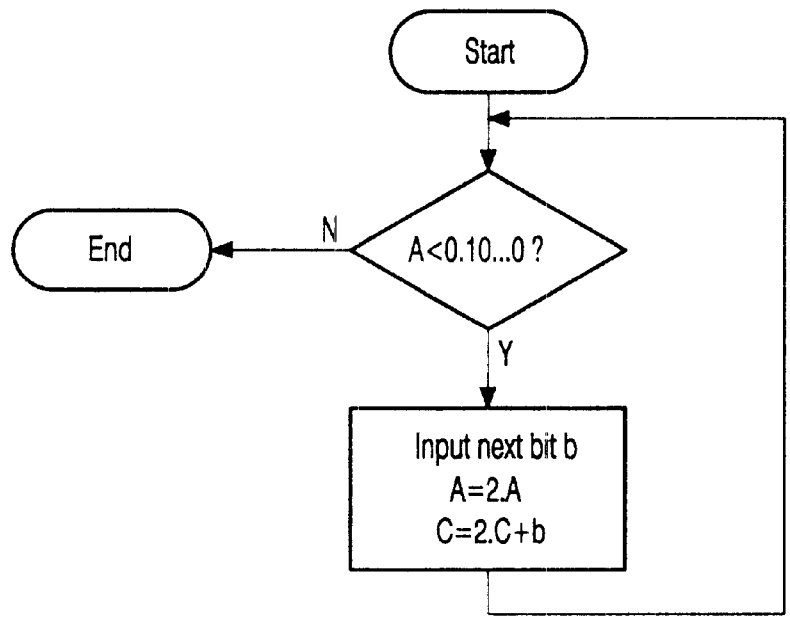
FIG. 3 shows a flow diagram of the encoder block denoted "Renormalize . . . " in FIG. 1.
Figure 5:
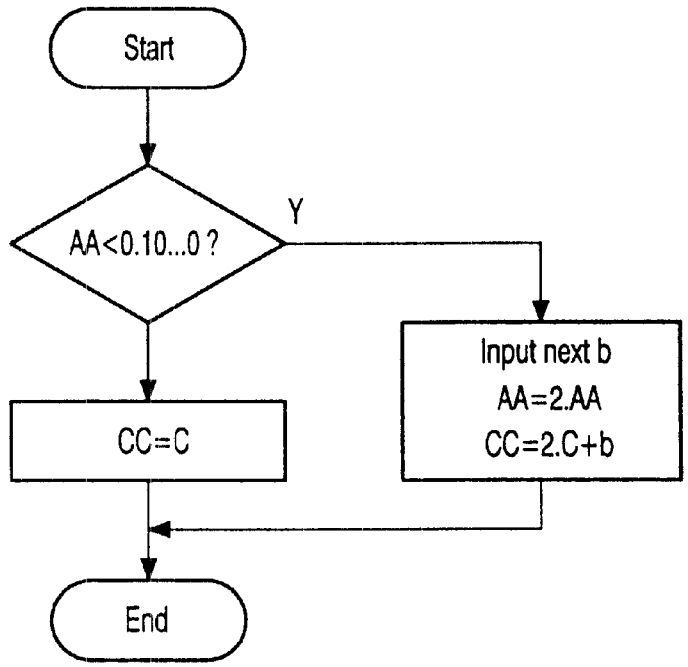
FIG. 5 shows a flow diagram of the decoder block denoted "Optimized Renormalize . . . " in FIG. 4.

The left branch now proceeds in a usual manner as described in WO 99/49579 (PHN 16.822). The right branch skips over the decoding of the first bit and immediately adjusts A as if the first bit has the MPS value. This adjusted value AA is then renormalized as usual. However, because for binary data the probability of the MPS (zero in this case) is always at least ½, the renormalization loop is iterated at most once, causing the loop to essentially disappear, as shown in the flow diagram of FIG. 5. After the execution of the "Optimised Renormalized AA . . . " block, the second bit is decoded in the normal way.

When the two parallel branches are joined, it is checked whether the value of the first decoded bit $b_1$ has indeed the MPS value. If not, the results of the second branch are completely discarded and only the first bit $b_1$ is outputted. If the speculation was correct and the first bit has the MPS value, both the first (MPS) and second bits are outputted and A and C are adjusted to hold the correct values (AA, CC), which are the same values as they would have after decoding two bits in the traditional sequential way.

Finally, the parameters A and C are renormalized as usual to prepare them in order to obtain the next one or two decoded output symbols.

Figure 6:
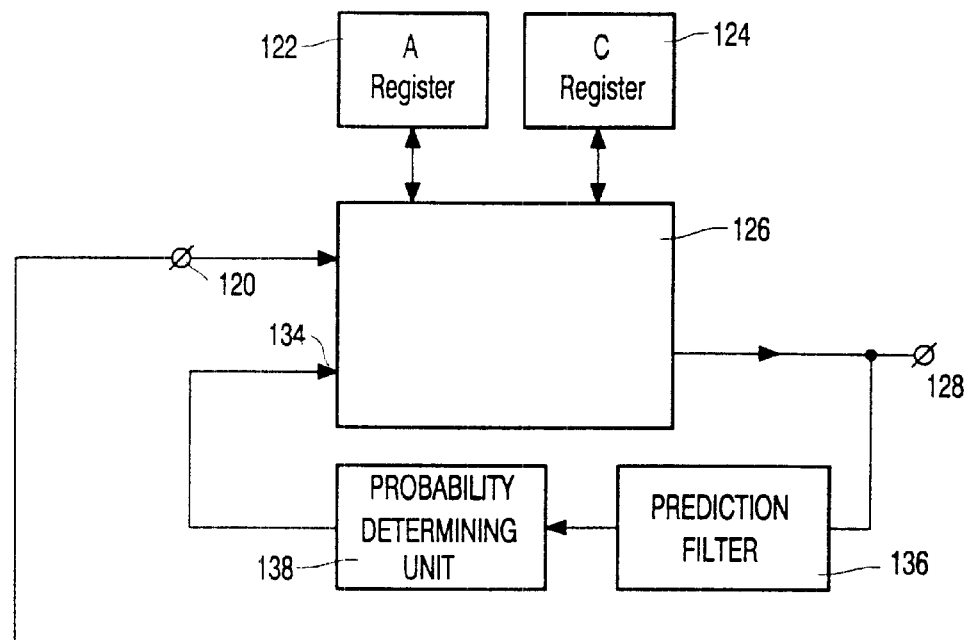
FIG. 6 shows an embodiment of the decoder apparatus.
Figure 6:
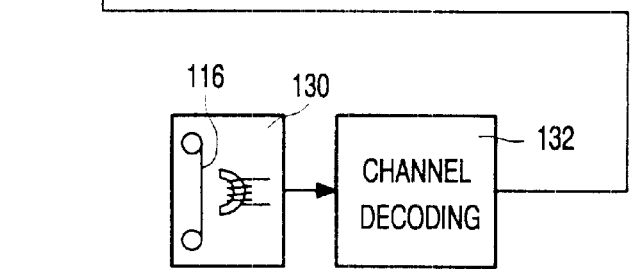

FIG. 6 shows an embodiment of the decoder apparatus in accordance with the invention. The decoder apparatus has an input terminal 120 for receiving the encoded information signal. Finite-size first and second registers 122 and 124 are present for storing the A parameter and the C parameter, respectively.

A processing unit 126 is available for carrying out the arithmetic decoding on the encoded information signal received via its input 120, in response to a probability signal supplied to the processing unit 126 via an input 134. The probability signal can be obtained in a well-known way. An example of deriving the probabilities for a 1-bit audio signal is shown in [Bruek97]. In this example, the probabilities are derived from the decoded output signal that is supplied to the output 128, namely by carrying out a prediction filtering on the decoded output signal in a prediction filter 136 and generating the probability signal in response to the output signal of the prediction filter 136 in the probability determining unit 138. It should be understood that, without going into very much detail as regards the processing unit 126, this unit comprises circuitry for retrieving the values for the A and C parameters from the first and second registers, as well as circuitry for storing the updated and renormalized values for A and C in the first and second registers 122 and 124, respectively, after a symbol has been decoded. The unit 126 further comprises circuitry for carrying out the steps shown in the FIGS. 4, 5, 2 and 3.

Preferably, the decoder apparatus further has a channel decoding unit 132, well known in the art, for channel decoding (and, if needed, error correcting) the channel encoded information signal into the arithmetically encoded information signal for the arithmetic decoder 126, and a read unit 130 for reading the channel encoded signal from a record carrier, such as the magnetic record carrier 116, or the optical record carrier 118.

Arithmetic coding is applied in most modern lossless and lossy coding schemes for video and audio. It can also be applied in the compression of computer data (such as, e.g., text files). The application envisaged here, is in lossless coding of 1-bit audio signals. Reference is made in this respect to U.S. Ser. No. 08/966,375, corresponding to EP patent application No.97201680.2 (PHN16405), U.S. Ser. No. 08/937,435, corresponding to international patent application No. IB 97/01156 (PHN 16452).

Whilst the invention has been described with reference to preferred embodiments thereof, it is to be understood that these are non-limitative examples. Thus, various modification may become apparent to those skilled in the art, without departing from the scope of the invention, as defined by the claims.

Further, the invention resides in each and every novel feature or combination of features.

REFERENCES

[Lang 84] G. G. Langdon, "An introduction to arithmetic coding", IBM J. Res. Develop., Vol. 28, pp. 135–149, March 1984.

[Bruek97] F. Bruekers et al, "Improved lossless coding of 1-bit audio signals", presented at 103rd Convention of the AES, Sep. 26–29, 1997, preprint 4563(I-6).

What is claimed is:

1. A method of arithmetically decoding an arithmetically encoded information signal into an output information signal comprising a serial sequence of n-bit symbols, where n is an integer and n=1, the method being adapted to produce a first and a second sequential output symbols of the output information signal in a decoding cycle, and comprising the steps of:
   (a) receiving the arithmetically encoded information signal,
   (b) retrieving from finite-size first and second registers values for an A and a C parameter respectively, the A parameter having a relationship with a size of a value interval, the C parameter having a relationship with a boundary of the interval,
   (c) generating a first probability value for a first symbol to be produced, the first probability value indicating the probability that the first symbol has a least probable value, and generating a second probability value for a second symbol to be produced, the second probability value indicating the probability that the second symbol has the least probable value,
   (d) deriving the first symbol in response to the first probability value, and in response to the values for A and C retrieved from the first and the second registers, respectively,
   (e) updating the A parameter so as to obtain an updated A parameter,
   (f) updating the value for A retrieved from the first register to a value for a temporary A parameter, for the case when the first symbol produced from decoding has a most probable value,
   (g) deriving a temporary C parameter from the C parameter retrieved from the second register,
   (h) deriving the second symbol in response to the second probability value, and in response to the values of the temporary A parameter and the temporary C parameter,
   (i) outputting both the first and the second symbol when the first symbol has the most probable value or outputting the first symbol only if the first symbol has the least probable value,
   (j) deriving new A and C parameters,
   (k) storing the new A and C parameter in the first and second register, respectively.

2. A method as claimed in claim 1, characterized in that the step (d) is carried out parallel to the sequence of steps (f), (g) and (h).

3. A method as claimed in claim 1, characterized in that, in the case that in step (i) the first symbol is outputted only, said step (j) comprises the substeps of
   deriving the new A parameter from the updated A parameter obtained in step (e), and
   deriving the new C parameter from the C parameter retrieved from the second register in step (d).

4. A method as claimed in claim 1, characterized in that, in the case that in step (i) both the first and second symbol are outputted, said step (j) comprises the substeps of
   deriving the new A parameter from the temporary A parameter derived in step (f), and
   deriving the new C parameter from the temporary C parameter derived in step (g).

5. A method as claimed in claim 4, characterized in that the step deriving the new A and C parameter comprises the substeps of
   updating the temporary A parameter so as to obtain an intermediate A parameter,
   updating the temporary C parameter in the case that the second symbol derived in step (h) has the least probable value, so as to obtain an intermediate C parameter,
   deriving the new A parameter from the intermediate A parameter, and
   deriving the new C parameter from the intermediate C parameter.

6. A method as claimed in claim 1, characterized in that the step (f) comprises the substeps of
   multiplying the A parameter retrieved from the first register by the first probability value so as to obtain a first parameter value,
   subtracting the first parameter value from the value for A, so as to obtain a second A parameter value,
   either equating the temporary A parameter to the second parameter value, or multiplying the second parameter value by a first constant, so as to obtain the value of the temporary A parameter.

7. A method as claimed in claim 6, characterized in that the step (g) comprises the substeps of (g1) comparing the second A parameter value with a second constant value and if, the second A parameter value is smaller than said second constant value, (g2) reading 1 bit of the arithmetically encoded information signal (g3) multiplying the C parameter by the first constant by shifting the bits of the C parameter by 1 bit position, and (g4) adding the 1 bit of the arithmetically encoded information signal obtained in step (g2) to the C parameter obtained in step (g3), so as to obtain the temporary C parameter, and, if the second A parameter value is greater than or equal to said second constant value, (g5) equating the temporary C parameter to the C parameter retrieved from the second register in step (b).

8. Decoding apparatus for carrying out the method as claimed in claim 1.

9. The decoding apparatus as claimed in claim 8, characterized in that it further comprises channel decoding means for channel decoding a channel encoded arithmetically encoded information signal so as to obtain the arithmetically encoded information signal, prior to arithmetic decoding.

10. The decoding apparatus as claimed in claim 9, characterized in that it further comprises read means (130) for reading the channel encoded arithmetically encoded information signal from a record carrier.

11. The decoding apparatus as claimed in claim 8, characterized in that it further comprises channel decoding means for channel decoding a channel encoded arithmetically encoded information signal so as to obtain the arithmetically encoded information signal, prior to arithmetic decoding.

12. The decoding apparatus as claimed in claim 11, characterized in that it further comprises read means for reading the channel encoded arithmetically encoded information signal from a record carrier.

13. Decoding apparatus for decoding an arithmetically encoded information signal into an output information signal comprising a serial sequence of n-bit symbols, where n is an integer and n=1, the apparatus being adapted to produce a first and a second sequential output symbols of the information signal in a decoding cycle, and comprising:

input means for receiving the arithmetically encoded information signal, finite sized first and second registers, the first register for storing an A parameter, the A parameter having a relationship with a size of a value interval, the second register for storing a C parameter, the C parameter having a relationship with a boundary of the interval, retrieval means for retrieving values for the A and the C parameter from the first and second registers, respectively, generator means for generating a first probability value for a first symbol to be produced, the first probability value indicating the probability that the first symbol has a least probable value, and for generating a second probability value for a subsequent symbol to be produced, the second probability value indicating the probability that the second symbol has the least probable value, first deriving means for deriving the first symbol in response to the first probability value, and in response to the values for A and C retrieved from the first and the second registers, respectively, first updating means for updating the A parameter so as to obtain an updated A parameter, second updating means updating the value for A retrieved from the first register to a value for a temporary A parameter, for the case when the first symbol produced from decoding has a most probable value, second deriving means for deriving a temporary C parameter from the C parameter retrieved from the second register, third deriving means for deriving the second symbol in response to the second probability value, and in response to the values of the temporary A parameter and the temporary C parameter, output means for outputting both the first and the second symbol when the first symbol has the most probable value or outputting the first symbol only if the first symbol has the least probable value, fourth deriving means for deriving new A and C parameters, means for storing the new A and C parameter in the finite sized first and second register, respectively.

\* \* \* \* \*